(12) United States Patent
Lin

(10) Patent No.: US 7,364,439 B2
(45) Date of Patent: Apr. 29, 2008

(54) MEMORY CARD ASSEMBLY

(75) Inventor: Le-Yao Lin, Taipei Hsien (TW)

(73) Assignee: Tai Twun Enterprise Co., Ltd., Taipei Hsien (TW)

( * ) Notice: Subject to any disclaimer, the term of this patent is extended or adjusted under 35 U.S.C. 154(b) by 0 days.

(21) Appl. No.: 11/518,345

(22) Filed: Sep. 8, 2006

(65) Prior Publication Data

US 2008/0009197 A1    Jan. 10, 2008

(30) Foreign Application Priority Data

Jul. 4, 2006    (TW) .............................. 95211697 U

(51) Int. Cl.
*H01R 12/00*    (2006.01)
(52) U.S. Cl. ..................... 439/76.1; 439/946
(58) Field of Classification Search ............... 439/76.1, 439/607, 946, 59, 62
See application file for complete search history.

(56) References Cited

U.S. PATENT DOCUMENTS 4,179,178 A * 12/1979 Bachman et al. ............. 439/59
4,380,360 A *  4/1983 Parmer et al. ................ 439/59

* cited by examiner

*Primary Examiner*—Khiem Nguyen
(74) *Attorney, Agent, or Firm*—Alan Kamrath; Kamrath & Associates PA

(57) ABSTRACT

A memory card assembly includes a memory card and a case. The memory card includes a first end with a USB interface and a second end. The case includes a compartment for removably receiving the second end of the memory card. The case further includes a coupling member extending from a wall defining the compartment. When the second end of the memory card is inserted into the compartment of the case, the coupling member and the first end of the memory card together form a coupling socket adapted for coupling with a coupling seat inside a coupling opening of a USB socket, with the USB interface located in the coupling socket and in electrical contact with contacts of the USB socket.

8 Claims, 14 Drawing Sheets

MEMORY CARD ASSEMBLY

BACKGROUND OF THE INVENTION

1. Field of the Invention

The present invention relates to a memory card assembly. More particularly, the present invention relates to a memory card assembly including a memory card and a case for receiving the memory card.

2. Description of the Related Art

Electronic cards are widely used in computers and electronic dictionaries for expanding memories, network cards, modems, and small computer system interfaces (SCSI) such as high-capacity hard disks, scanners, etc. In addition to personal computer memory card international association (PCMCIA) cards, electronic cards include multi-media cards (MMC), compact flash cards (CF), smart media cards (SMC), memory sticks (MS), and secure digital memory cards (SD) for use in personal digital assistants (PDA), portable electronic dictionaries, digital cameras, etc.

However, most memory cards have an interface of a specific specification and thus cannot be used with the connection interface of the widely used USB (universal serial bus) specification. FIG. 1 of the drawings illustrates a dual-interface memory card 90 including a USB interface 91 and a read/write interface 92 respectively on two ends thereof. A user may either couple the USB interface 91 with a USB socket 93 of an electronic device (not labeled) or couple the read/write interface 92 with a read/write interface socket (not shown) for access to read/write data.

A typical dual-interface memory card 90 has a uniform thickness which is generally designed for the end with the read/write interface 92 that is generally smaller than the thickness of a standard coupling opening of a USB socket. Thus, the other end of the dual-interface memory card 90 with the USB interface 91 is too thin to match with the coupling opening 94 of the USB socket 93. As a result, the USB interface 91 cannot be in reliable electronic contact with the resilient conductive plates 96 of the USB socket 93 when an end of the dual-interface memory card 90 is inserted into the coupling seat 95 inside the coupling opening 94 of the USB socket 93. Further, the memory card 90 is in loose engagement with the USB socket 93 and thus liable to disengage from the USB socket 93.

SUMMARY OF THE INVENTION

In accordance with an aspect of the present invention, a memory card assembly includes a memory card and a case. The memory card includes a first end with a USB interface and a second end. The case includes a compartment for removably receiving the second end of the memory card. The case further includes a coupling member extending from a wall defining the compartment. When the second end of the memory card is inserted into the compartment of the case, the coupling member and the first end of the memory card together form a coupling socket adapted for coupling with a coupling seat inside a coupling opening of a USB socket, with the USB interface located in the coupling socket and in electrical contact with contacts of the USB socket.

Preferably, the memory card further includes a read/write interface.

In an example, the coupling member includes a horizontal plate and two lateral plates on two sides of the horizontal plate. The first end of the memory card is opposite to the horizontal plate when the second end of the memory card is inserted into the compartment of the case.

In another example, the coupling member further includes a second horizontal plate that cooperates with the horizontal plate and the lateral plates to form a hollow, rectangular frame for receiving the first end of the memory card.

In a further example, each lateral plate includes a slit for receiving the first end of the memory card.

In still another example, the compartment of the case extends to the coupling member for receiving the first end of the memory card.

In yet another example, the case includes two lateral sides each having an arcuate recessed portion. Each arcuate recessed portion has a slot in communication with the compartment of the case.

In still another example, the case includes a slot in a side thereof and in communication with the compartment.

The memory card assembly may further comprise means for positioning the memory card and the case.

In an example, a protrusion is provided on one of the memory card and the case and a recess is provided in the other of the memory card and the case for engaging with the protrusion.

In accordance with another aspect of the present invention, a case is provided for a memory card of the type having a first end with a USB interface and a second end. The case includes a compartment for removably receiving the second end of the memory card. The case further includes a coupling member extending from a wall defining the compartment. When the second end of the memory card is inserted into the compartment of the case, the coupling member and the first end of the memory card together form a coupling socket adapted for coupling with a coupling seat inside a coupling opening of a USB socket, with the USB interface located in the coupling socket and in electrical contact with contacts of the USB socket.

Other objectives, advantages, and features of the invention will become more apparent from the following detailed description when taken in conjunction with the accompanying drawings.

DETAILED DESCRIPTION OF THE PREFERRED EMBODIMENTS

Figure 1:
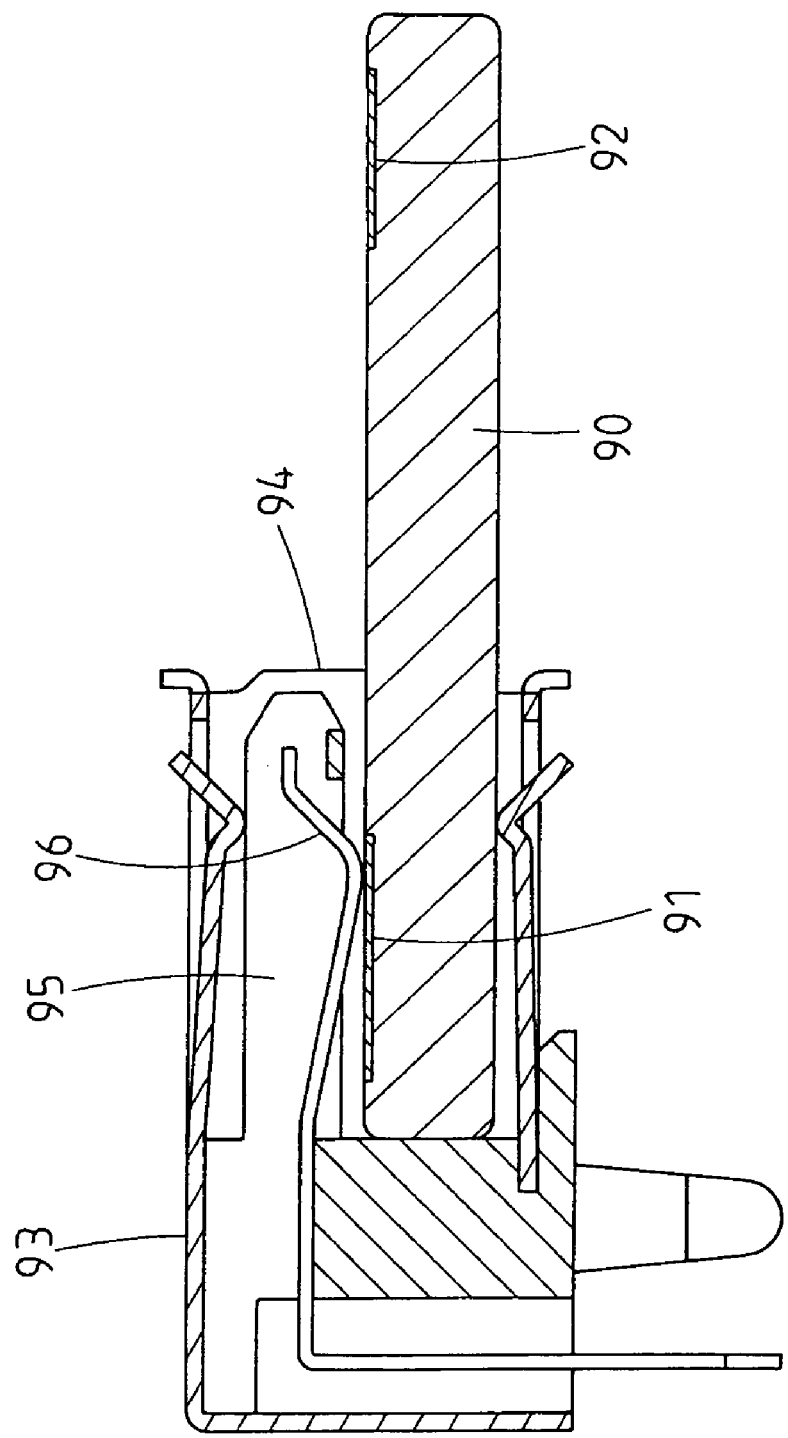
FIG. 1 is a sectional view of a USB socket of an electronic device and a conventional dual-interface memory card.

Referring to FIGS. 2 through 6, a memory card assembly in accordance with the present invention comprises a memory card 10 and a case 20 in which the memory card 10 is removably received. The memory card assembly can be engaged with a coupling opening 31 of a USB socket 30 (see FIG. 7) and provide reliable contact with contacts (shown as resilient conductive plates 33 in this embodiment in the coupling seat 32 inside the coupling opening 31.

Figure 4:
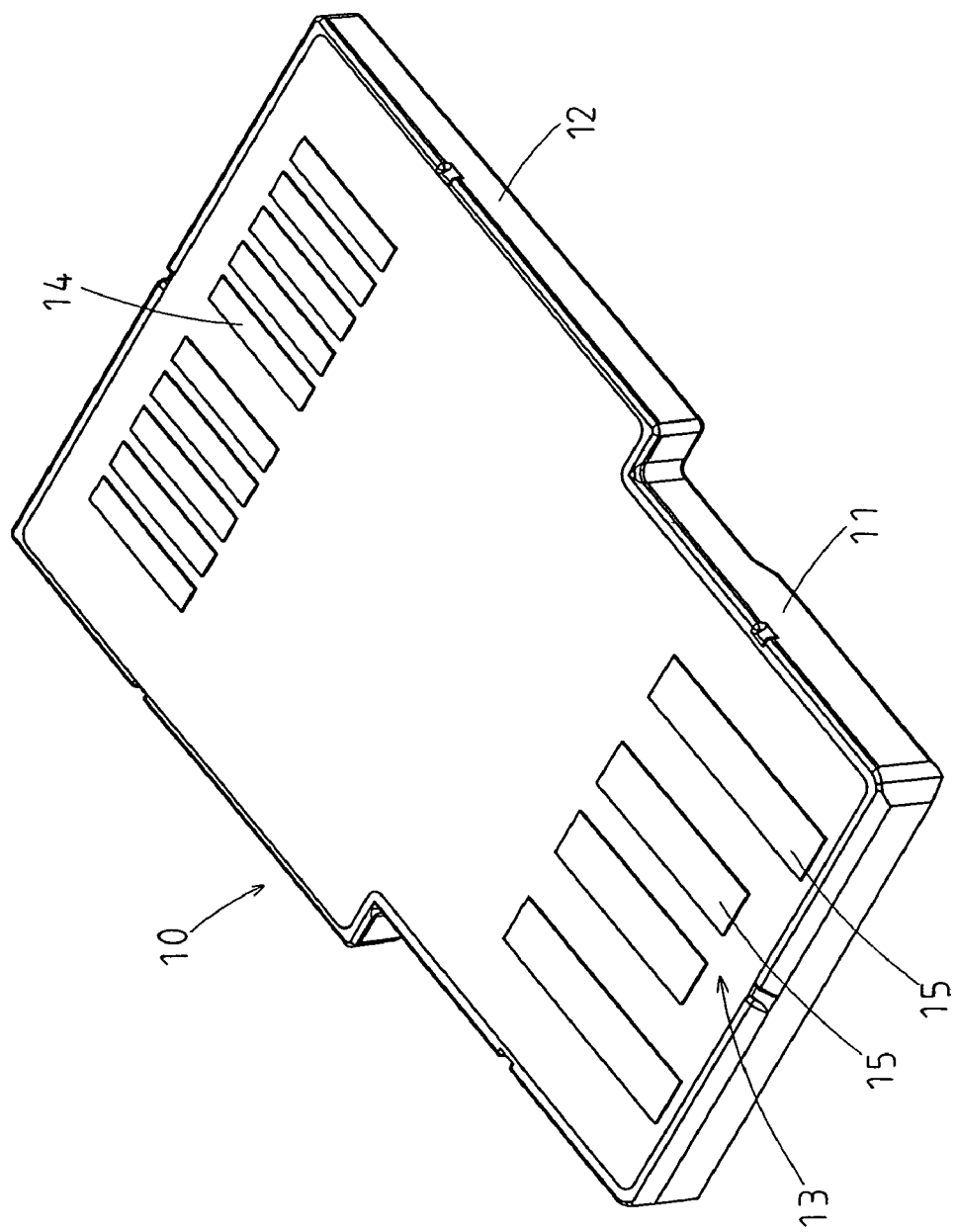
FIG. 4 is a perspective view of a memory card of the memory card assembly in accordance with the present invention.
Figure 5:
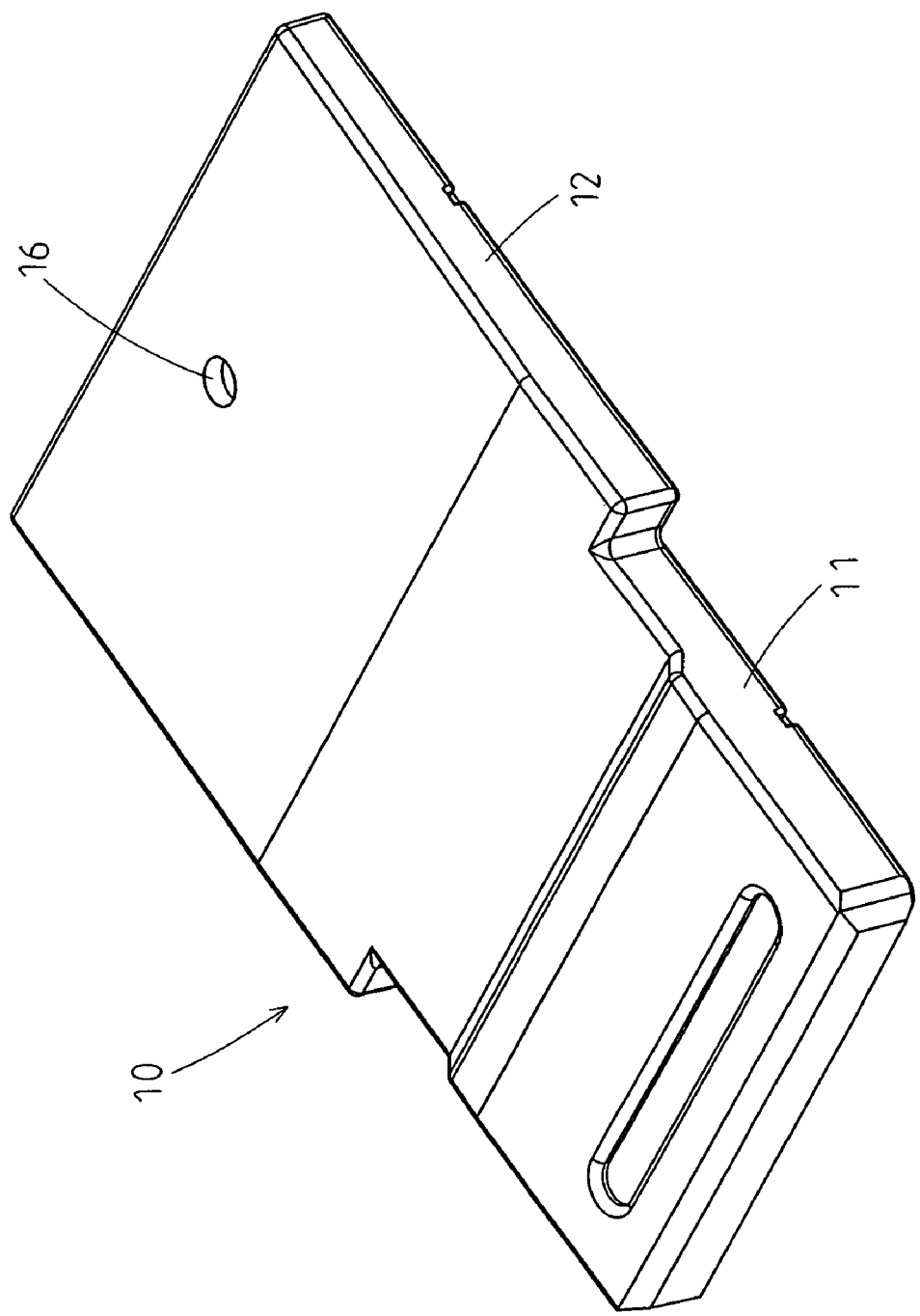
FIG. 5 is another perspective view showing the other side of the memory card in FIG. 4.

Referring to FIGS. 4 and 5, the memory card 10 includes a first end 11 and a second end 12. A USB interface 13 is provided on the first end 11 of the memory card 10 and includes a plurality of contacts 15.

Figure 2:
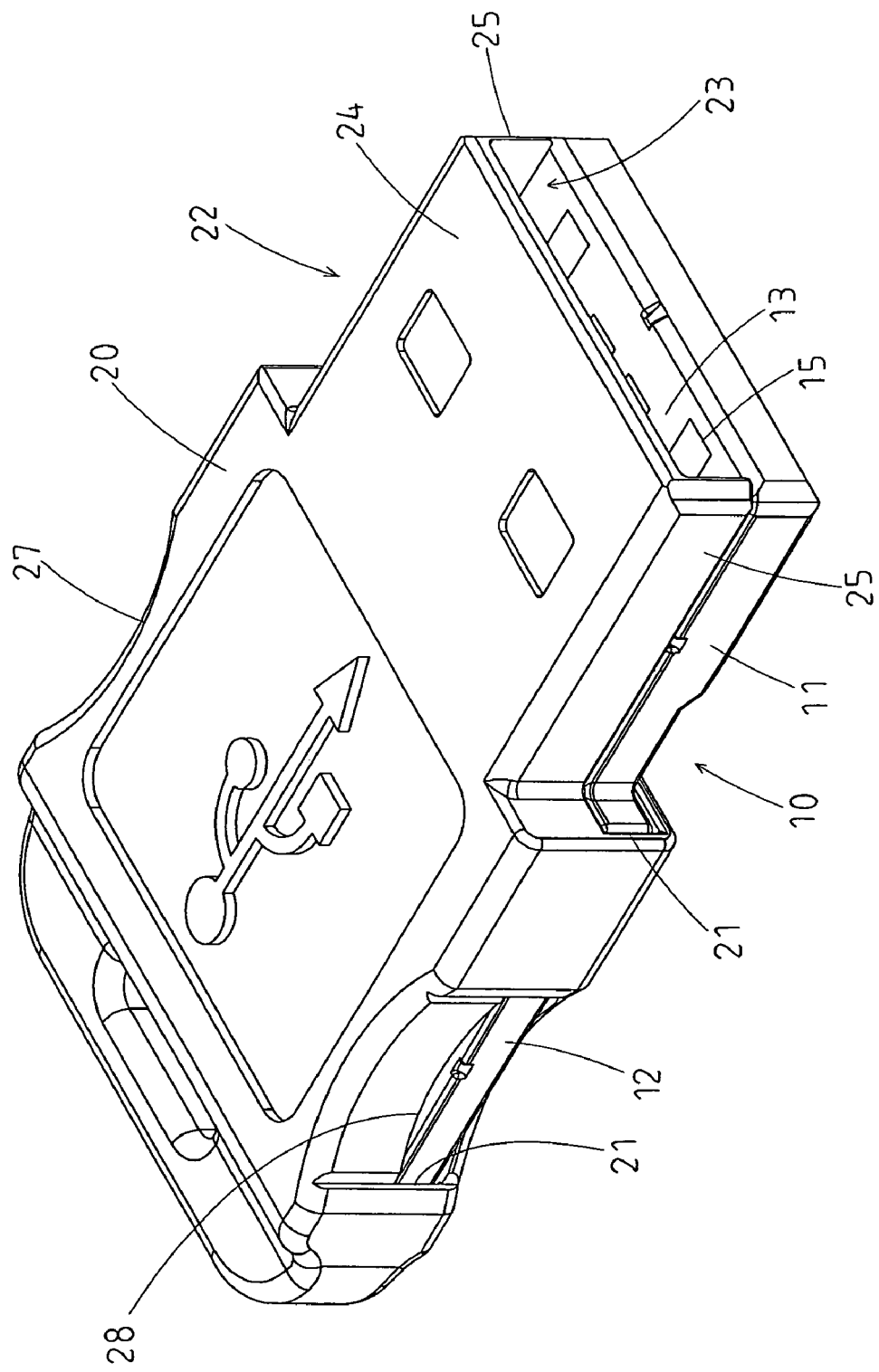
FIG. 2 is a perspective view of a memory card assembly in accordance with the present invention.
Figure 3:
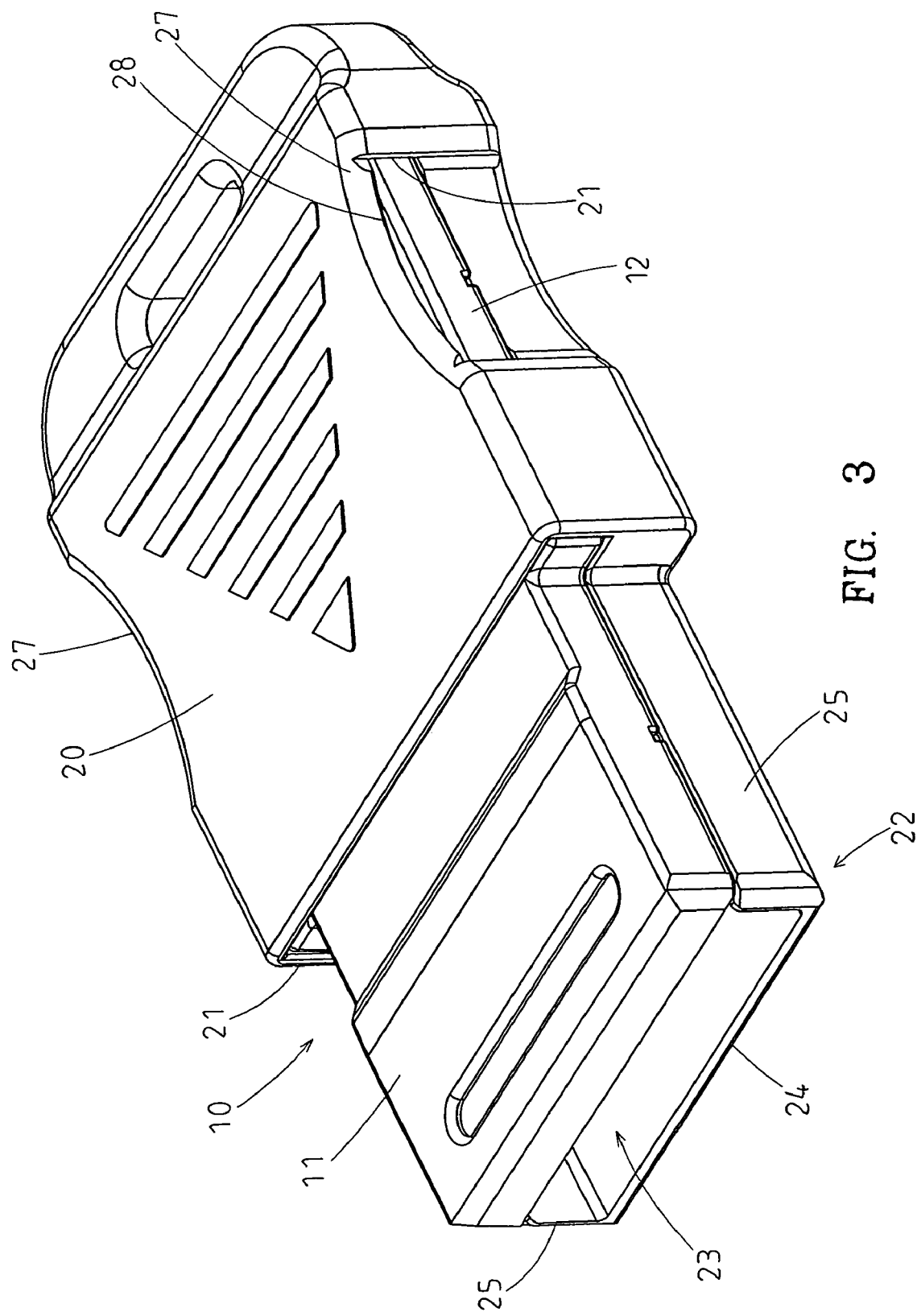
FIG. 3 is another perspective view showing the other side of the memory card assembly in FIG. 2.
Figure 6:
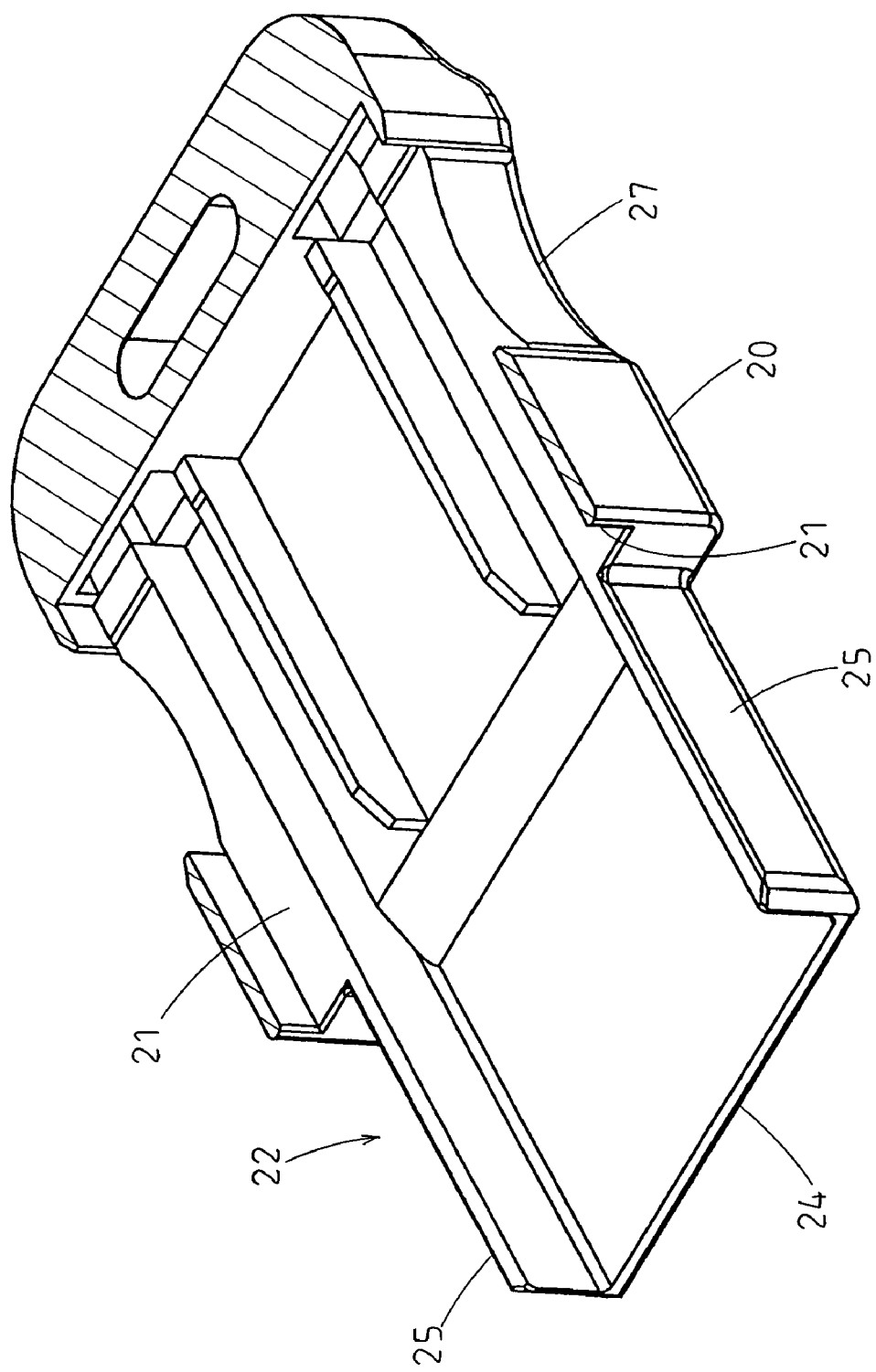
FIG. 6 is a perspective view, partly cutaway, of a case of the memory card assembly in accordance with the present invention.

Referring to FIGS. 2, 3, and 6, the case 20 includes a compartment 21 into which the second end 12 of the memory card 10 is inserted. The case 20 further includes a coupling member 22 extending from a wall defining the compartment 21. Preferably, the coupling member 22 has an end face aligned with an end face of the first end 11 of the memory card 10 coupled with the case 20. The coupling member 22 and the first end 11 of the memory card 10 together form a coupling socket 23 for coupling with the coupling opening 31 of the USB socket 30 (see FIG. 7).

The memory card 10 may include a USB interface 13 only for use as a USB memory card. Nevertheless, the memory card 10 may include a USB interface 13 and a read/write interface 14 (see FIG. 4). The read/write interface 14 may be an SD read/write interface, an MS read/write interface, or another type. Nevertheless, the read/write interface 14 of the memory card 10 must be converted into a read/write interface of a standard specification via an adaptor (not shown) for the purposes of coupling with a read/write socket of a standard specification.

Figure 8:
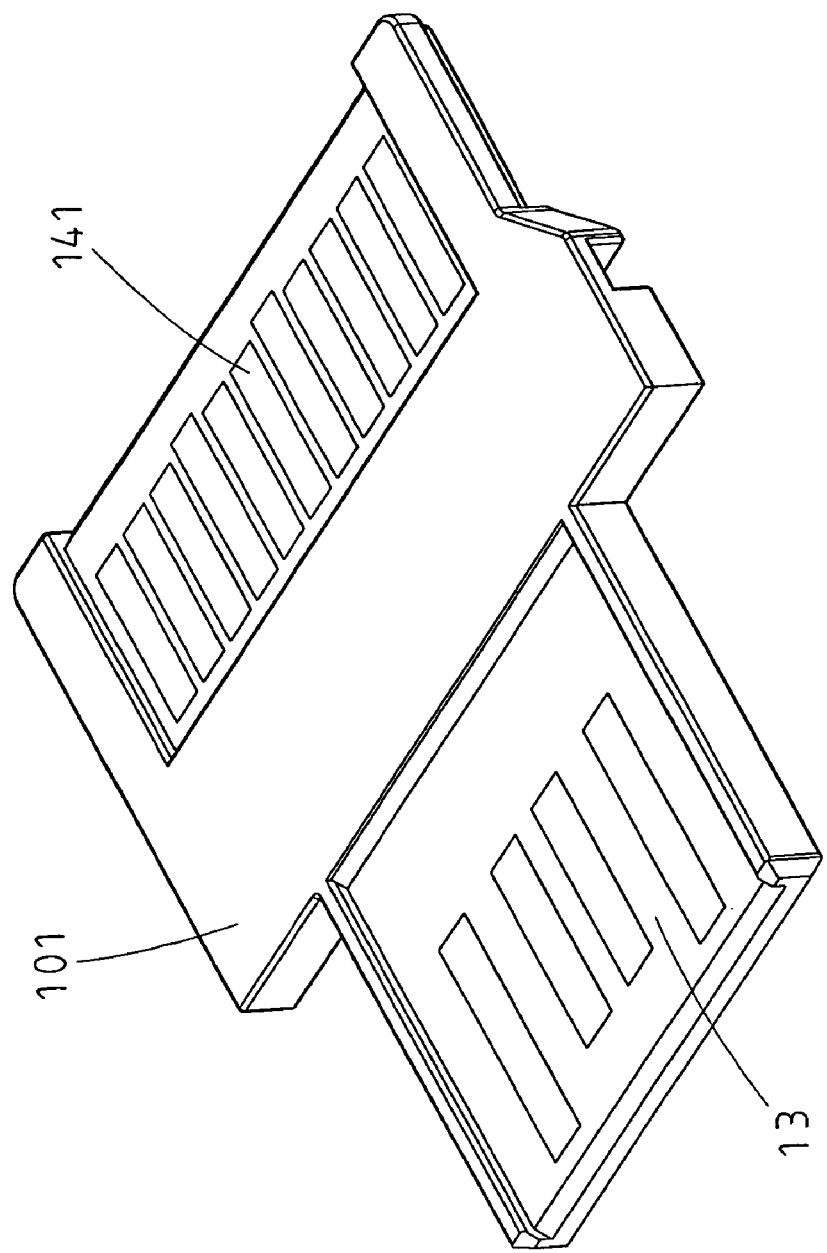
FIG. 8 is a perspective view illustrating another example of the memory card in accordance with the present invention.
Figure 9:
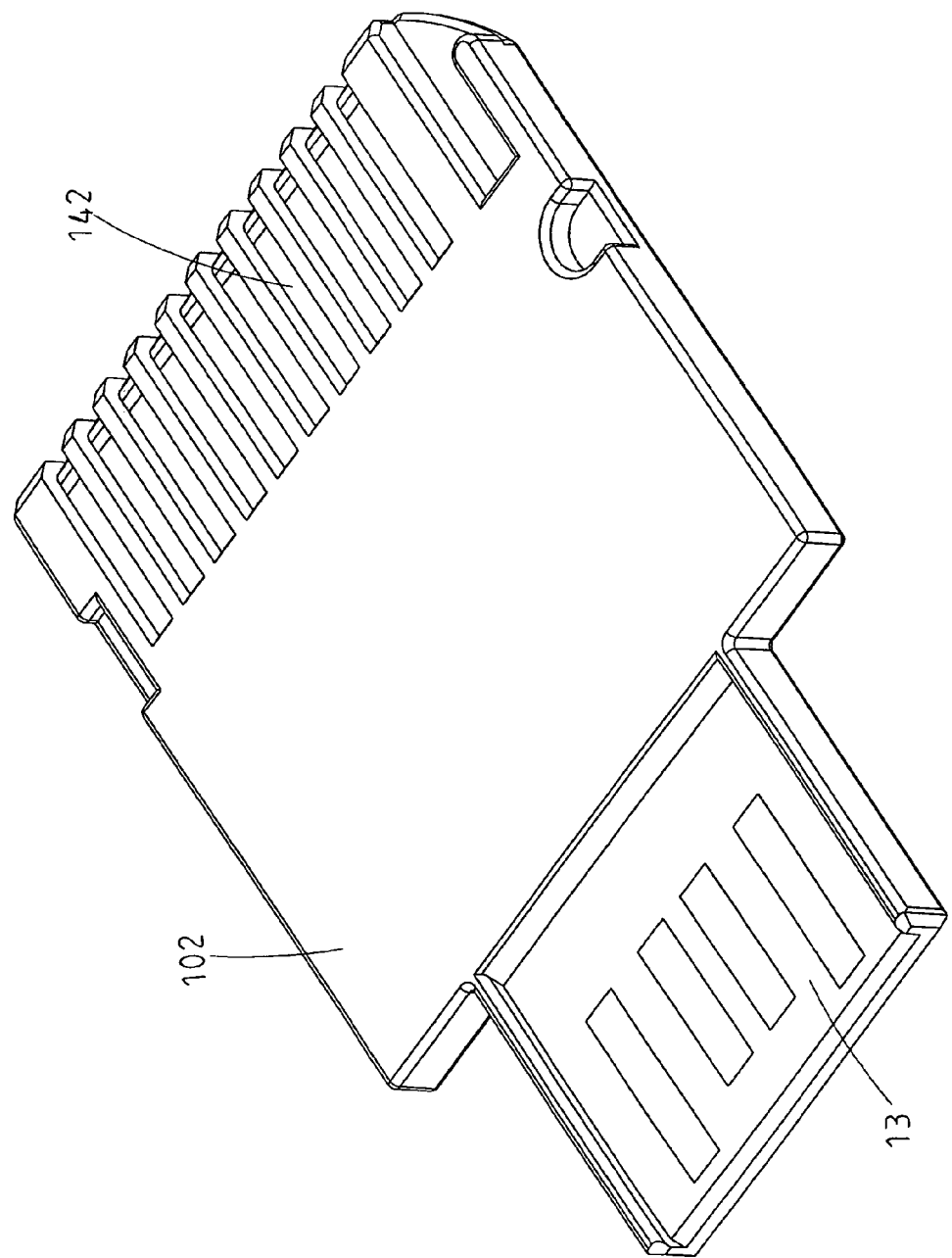
FIG. 9 is a perspective view illustrating a further example of the memory card in accordance with the present invention.

In another example shown in FIG. 8, the memory card (now designated by 101) includes a MINI SD read/write interface 141 of a standard specification. In a further example shown in FIG. 9, the memory card (now designated by 102) includes an MS DUO read/write interface 142 of a standard specification.

Figure 7:
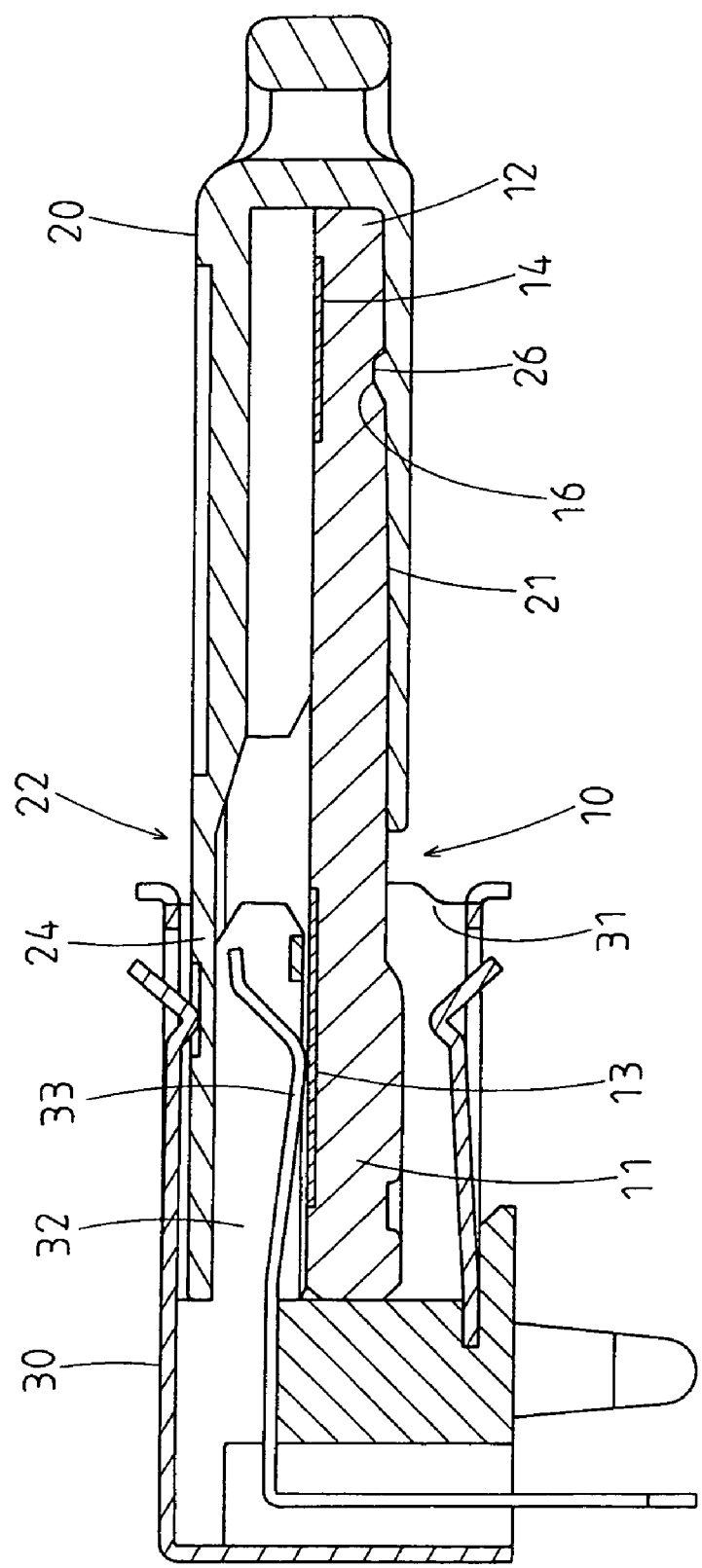
FIG. 7 is a sectional view illustrating use of the memory card assembly in FIG. 2.

With reference to FIGS. 2 and 7, in use, the second end 12 of the memory card 10 is inserted into the compartment 21 of the case 20, with the first end 11 of the memory card 10 and the coupling member 22 of the case 20 together forming a coupling socket 23 for coupling with a coupling seat 32 inside the coupling opening 31 of the USB socket 30. The USB interface 13 and its contacts 15 are located in the coupling socket 23 for reliable contact with the resilient conductive plates 33 of the USB socket 30, thereby enhancing electronic contact stability while preventing the memory card 10 and the case 20 from disengaging from the USB socket 30.

With reference to FIGS. 2, 3, and 6, the coupling member 22 of the case 20 includes a horizontal plate 24 and two lateral plates 25 respectively on two lateral sides of the horizontal plate 24. The first end 11 of the memory card 10 is located opposite to the horizontal plate 24 when the second end 12 of the memory card 10 is inserted into the compartment 21 of the case 20, thereby forming the coupling socket 23. Each of two lateral sides of the case 20 may include an arcuate recessed portion 27. Further, the compartment 21 of the case 20 extends through the arcuate recessed portion 27. Specifically, each arcuate recessed portion 27 includes a slot 28 in communication with the compartment 21 of the case 20. By such an arrangement, a user may grasp the second end 12 of the memory card 10 and the case 20 at the same time while gripping the case 20 by the arcuate recessed portions 27, allowing easy, smooth removal of the memory card assembly from the USB socket 30 (see FIG. 2).

With reference to FIGS. 5 and 7, a positioning means is provided between the second end 12 of the memory card 10 and the compartment 21 of the case 20. In this example, the second end 12 of the memory card 10 includes a hole or recess 16 whereas a wall defining the compartment 21 of the case 20 includes a protrusion 26 for engaging with the recess 16.

Figure 10:
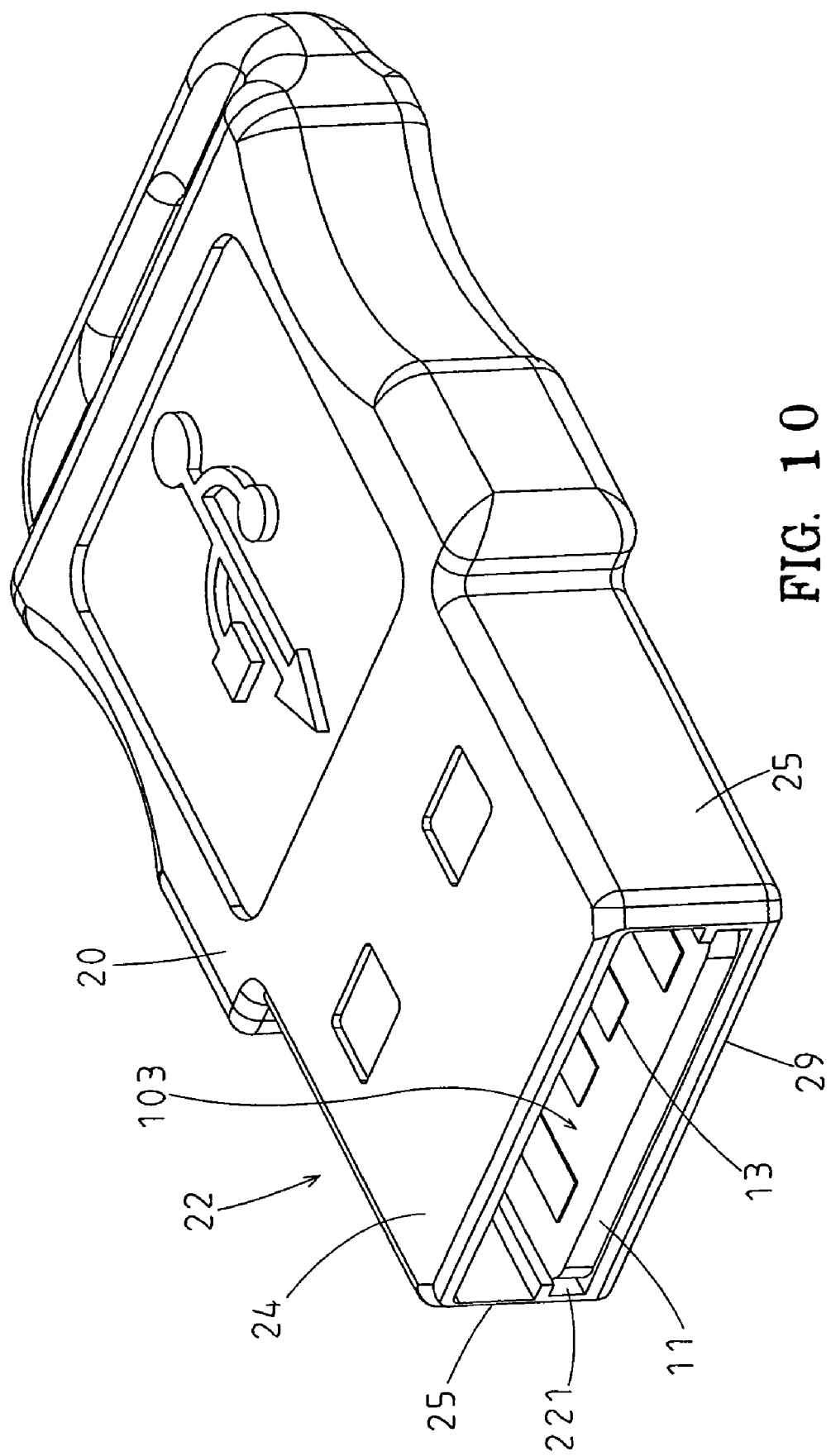
FIG. 10 is a perspective view illustrating a modified embodiment of the memory card assembly in accordance with the present invention.
Figure 11:
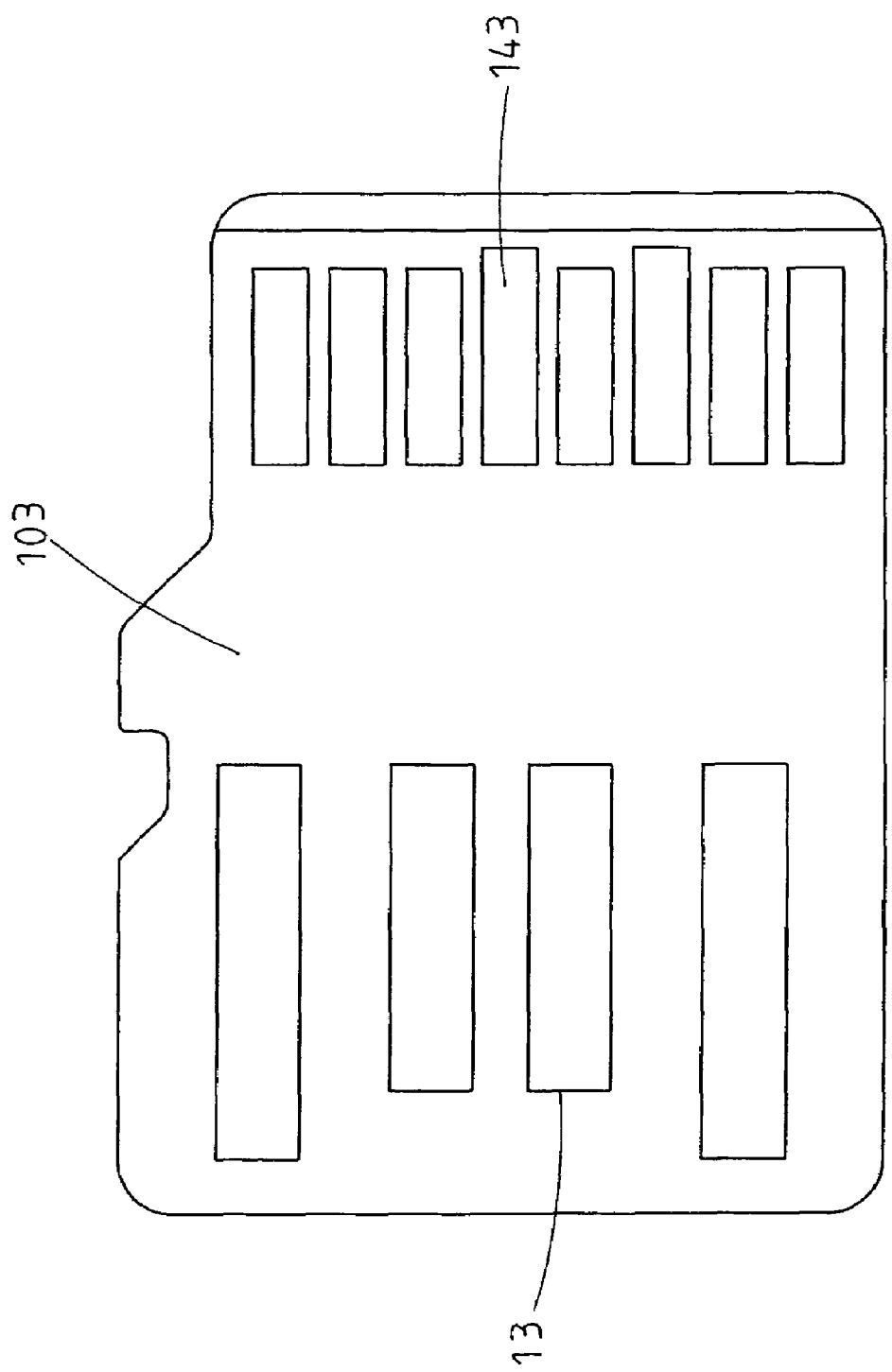
FIG. 11 is a plan view of a memory card of the memory card assembly in FIG. 10.
Figure 12:
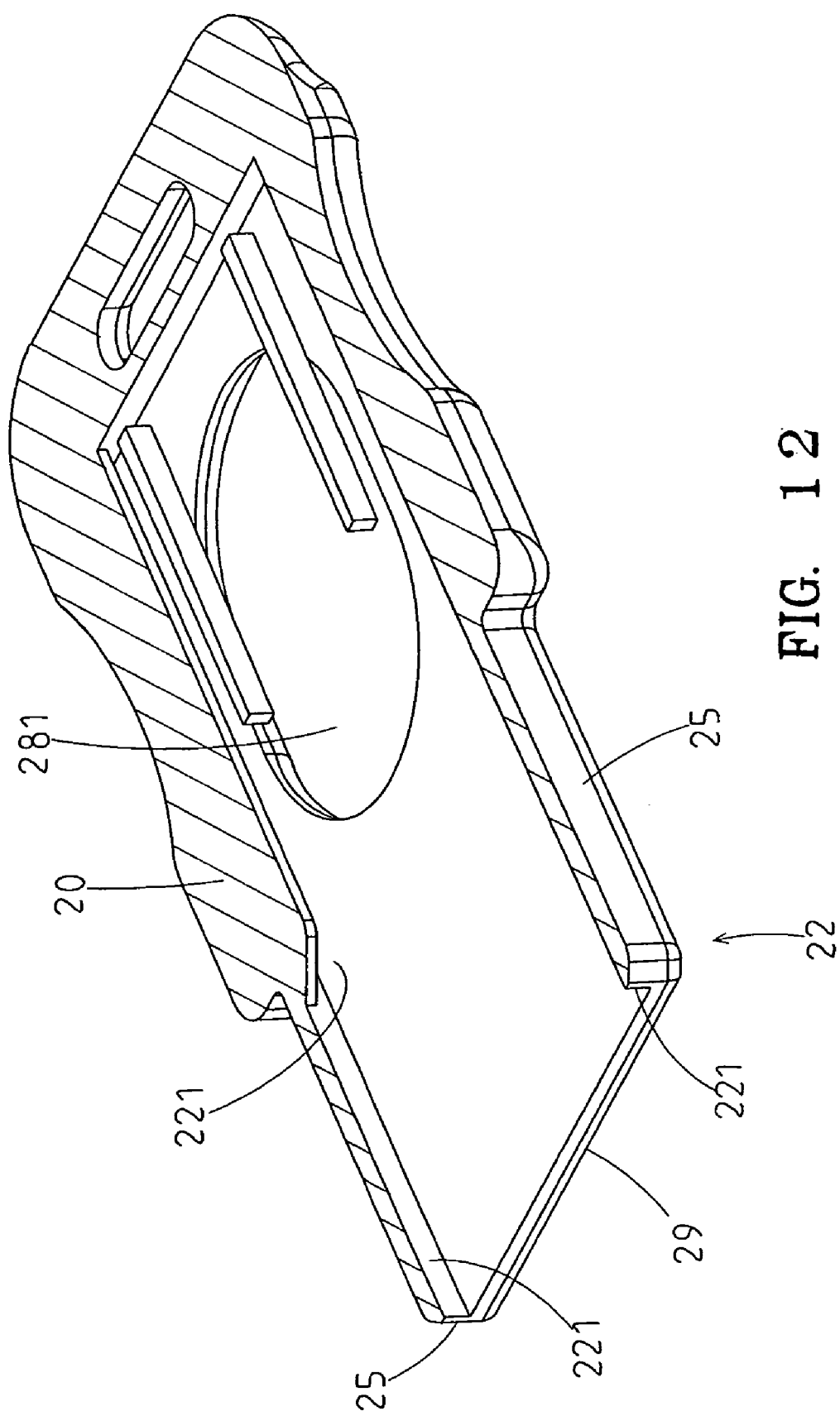
FIG. 12 is a perspective view, partly cutaway, of a case of the memory card assembly in FIG. 10.

FIGS. 10 through 12 illustrate a modified embodiment of the memory card assembly in accordance with the present invention. In this embodiment, the coupling member 22 of the case 20 includes another horizontal plate 29 that cooperates with the horizontal plate 24 and the lateral plates 25 to form a hollow rectangular frame for receiving the first end 11 of the memory card (now designated by 103). The memory card 103 may include a MICRO SD read/write interface 143 or a MICRO MMC read/write interface. The case 20 further includes a slot 281 in a side thereof and in communication with the compartment (now designated by 221), allowing the user to grasp and pull the memory card 103 and the case 20 simultaneously while detaching the memory card assembly from an electronic device (not shown). Further, the compartment 221 of the case 20 extends to the coupling member 22 for receiving the first end 11 of the memory card 103.

Figure 13:
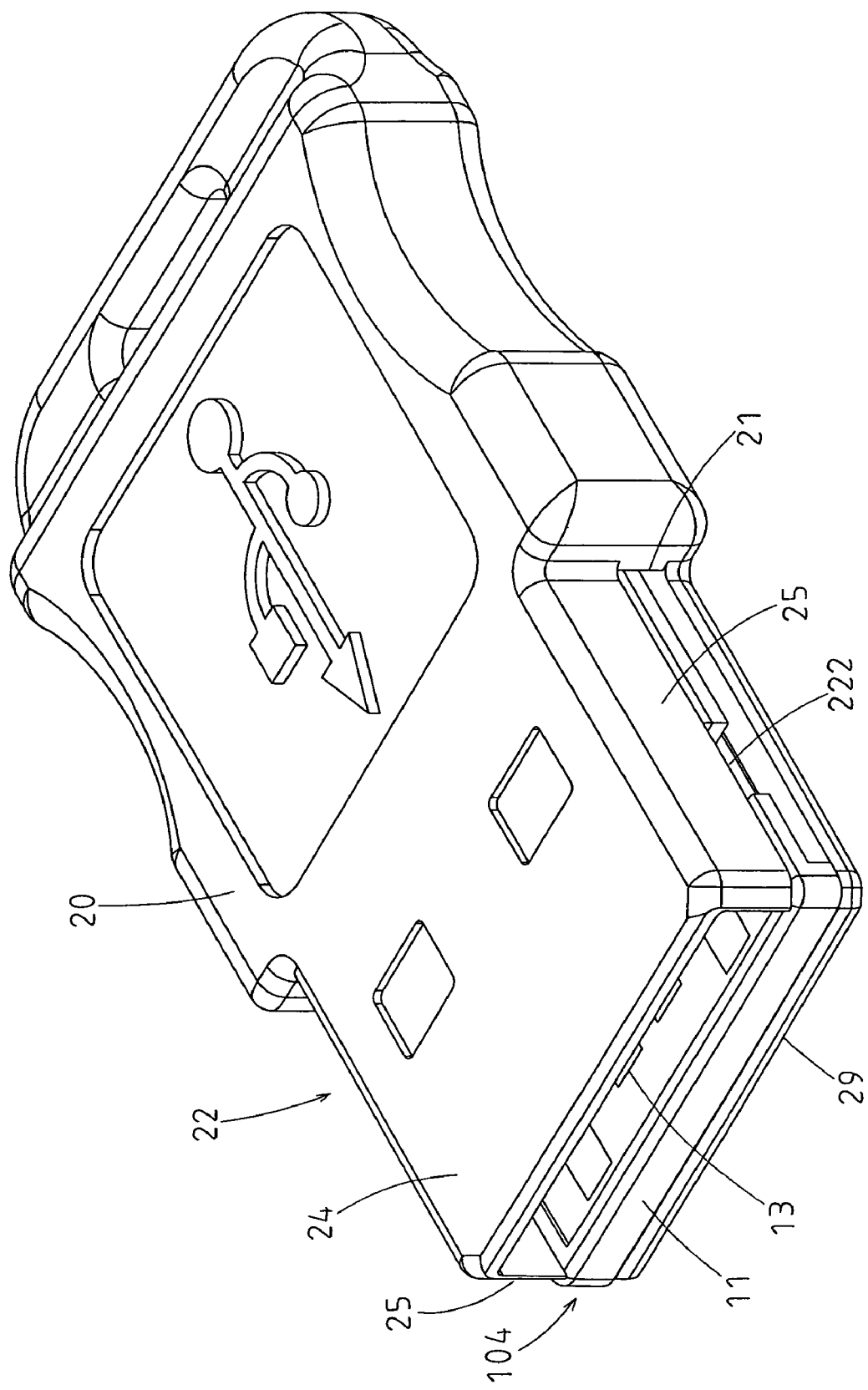
FIG. 13 is a perspective view illustrating another modified embodiment of the memory card assembly in accordance with the present invention.
Figure 14:
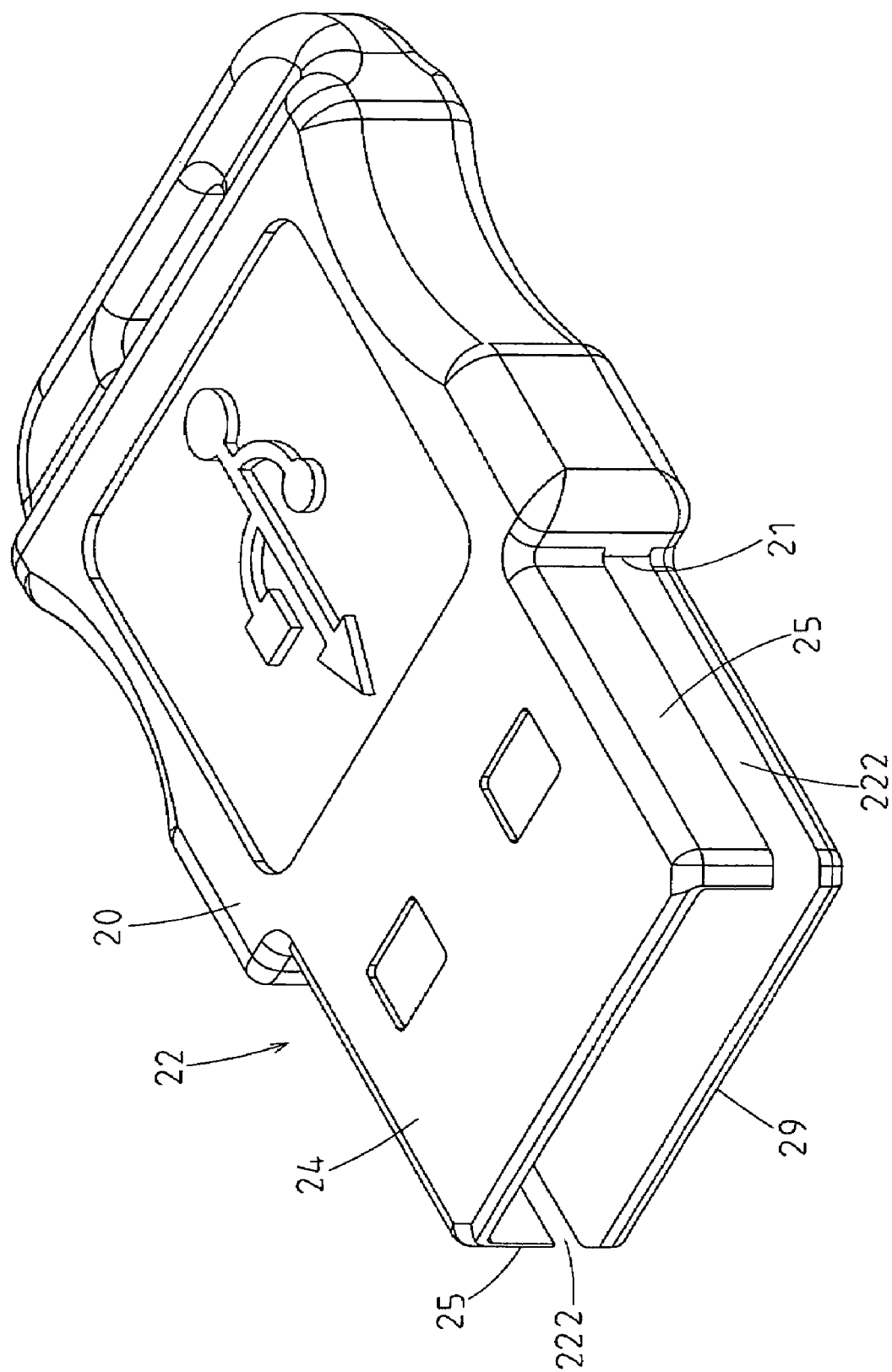
FIG. 14 is a perspective view of a case of the memory card assembly in FIG. 13.

FIGS. 13 and 14 illustrate another modified embodiment of the memory card assembly in accordance with the present invention modified from the embodiment shown in FIGS. 10-12. In this embodiment, a slit 222 is defined in each lateral plate 25 of the coupling member 22 of the case 20 for receiving the first end 11 of the memory card (now designated by 104). The memory card 104 may be a standard M2 read/write interface or a standard MINI SD read/write interface.

As is apparent from the foregoing, the memory card 10 and the case 20 in accordance with the present invention together form a memory card assembly having a coupling socket 23 of the USB interface type for coupling with the coupling seat 32 in a USB socket 30, allowing reliable contact with the resilient conductive plates 33 in the USB socket 30 while preventing the memory card assembly from disengaging from the USB socket 30.

Although specific embodiments have been illustrated and described, numerous modifications and variations are still possible without departing from the essence of the invention. The scope of the invention is limited by the accompanying claims.

What is claimed is:

1. A memory card assembly comprising:
   a memory card including a first end and a second end opposite the first end, with the first end of the memory card including a USB interface, with the second end of the memory card including a read/write interface; and a case including a compartment for removably receiving the second end of the memory card, with the case further including a coupling member extending from a wall defining the compartment, with the coupling member having a horizontal plate with a first side and a second side opposite the first side, a first lateral plate and a second lateral plate, with the first lateral plate connected to the first side, with the second lateral plate connected to the second side, with the horizontal plate and the first and second lateral plates forming a substantially U-shaped structure, with the case being free of electrical connection with the memory card, with a protrusion on one of the memory card and the case, with a recess in the other of the memory card and the case, and with the recess snap-fitted with the protrusion, with the recess removable from the protrusion without disassembly of the case, and with the memory card removable from the case without disassembly of the case;

wherein when the second end of the memory card is inserted into the compartment of the case, the read/write interface is concealed, with the read/write interface unusable when concealed, with the first end of the memory card opposite to and spaced from the horizontal plate of the coupling member, with the coupling member and the first end of the memory card together forming a substantially rectangular coupling socket adapted for coupling with a coupling seat inside a coupling opening of a USB socket, and with the USB interface located in the substantially rectangular coupling socket and in electrical contact with resilient coupling plates of the USB socket; and wherein when the second end of the memory card is removed from the compartment of the case, the read/write interface is exposed, with the read/write interface usable when exposed.

2. The memory card assembly as claimed in claim 1 wherein the coupling member further includes a second horizontal plate generally parallel to the horizontal plate and having a first plate side and a second plate side opposite the first plate side, with the first lateral plate connected to the first plate side, with the second lateral plate connected to the second plate side, and with the second horizontal plate cooperating with the horizontal plate and the first and second lateral plates to form a hallow, rectangular frame receiving the first end of the memory card.

3. The memory card assembly as claimed in claim 2 wherein each of said first and second lateral plate includes a slit for receiving the first end of the memory card.

4. The memory card assembly as claimed in claim 1 wherein the compartment of the case extends to the coupling member for receiving the first end of the memory card.

5. The memory card assembly as claimed in claim 1 wherein the case includes two lateral sides each having an arcuate recessed portion, with each said arcuate recessed portion having a slot in communication with the compartment of the case.

6. A memory card assembly comprising:

a USB socket having resilient coupling plates and a coupling seat inside a coupling opening, with the USB socket having a first cantilever connected to a first detent and a second cantilever connected to a second detent, with the first detent spaced from and parallel to the second detent;

a memory card including a first end and a second end opposite the first end, with the first end of the memory card including a USB interface, with the second end of the memory card including a read/write interface; and a case comprising a compartment removably receiving the second end of the memory card, with the case further including a coupling member extending from a wall defining the compartment, with the coupling member having a horizontal plate with a first side and a second side opposite the first side, a first lateral plate and a second lateral plate, with the first lateral plate connected to the first side, with the second lateral plate connected to the second side, with the horizontal plate and the first and second lateral plates forming a substantially U-shaped structure, with the case being free of electrical connected with the memory card, with the horizontal plate having a first depression and a second depression, with the first depression spaced from the second depression, with the first detent reversibly engagable in the first depression, with the second detent reversibly engageable in the second depression, and with the horizontal plate stably engaged with the USB socket by the respective engagement of the first and second detents with the first and second depressions;

wherein when the second end of the memory card is inserted into the compartment of the case, the read/write interface is concealed, with the read/write interface unusable when concealed, with the first end of the memory card opposite to and spaced from the horizontal plate of the coupling member, with the coupling member and the first end of the memory card together forming a substantially rectangular coupling socket coupling with the coupling seated inside the coupling opening of the USB socket, and with the USB interface located in the substantially rectangular coupling socket and in electrical contact with the resilient coupling plates of the USB socket; and wherein when the second end of the memory card is removed from the compartment of the case, the read/write interface is exposed, with the read/write interface usable when exposed.

7. The memory card assembly as claimed in claim 1 wherein the memory card has a first surface and a second surface opposite the first surface, with the second end of the memory card having a card thickness extending from the first surface to the second surface, with the recess having a recess depth less than the card thickness.

8. The memory card assembly as claimed in claim 1 further comprising first and second depressions in the horizontal plate with the first depression spaced from the second depression, with the USB socket having a first cantilever connected to a first detent, with the first detent reversibly engageable in the first depression, with the USB socket having a second cantilever connected to a second detent, with the second detent reversibly engageable in the second depression, and with the horizontal plate stably engaged with the USB socket by the respective engagement of the first and second detents with the first and second depressions.

* * * * *